(12) United States Patent
Shibata et al.

(10) Patent No.: US 8,756,474 B2
(45) Date of Patent: Jun. 17, 2014

(54) METHOD FOR INITIATING A REFRESH OPERATION IN A SOLID-STATE NONVOLATILE MEMORY DEVICE

(75) Inventors: Hiroaki Shibata, Novi, MI (US); Koji Shinoda, Farmington Hills, MI (US); Brian W. Hughes, Rochester Hills, MI (US)

(73) Assignees: DENSO International America, Inc., Southfield, MI (US); Denso Corporation, Kariya-shi, Aichi-ken (JP)

(*) Notice: Subject to any disclaimer, the term of this patent is extended or adjusted under 35 U.S.C. 154(b) by 440 days.

(21) Appl. No.: 13/052,305

(22) Filed: Mar. 21, 2011

(65) Prior Publication Data

US 2012/0246525 A1    Sep. 27, 2012

(51) Int. Cl.
*H03M 13/00* (2006.01)
*G06F 13/00* (2006.01)
*G11C 7/00* (2006.01)

(52) U.S. Cl.
USPC ............................. 714/754; 711/106; 365/222

(58) Field of Classification Search
USPC ...................... 714/704, 754; 711/106; 365/222
See application file for complete search history.

(56) References Cited

U.S. PATENT DOCUMENTS

| | | | | |
|---|---|---|---|---|
| 6,269,039 | B1* | 7/2001 | Glossner et al. ............ | 365/210.1 |
| 7,010,644 | B2* | 3/2006 | Gilton ............................. | 711/106 |
| 7,024,571 | B1* | 4/2006 | Reger et al. .................... | 713/323 |
| 7,139,937 | B1* | 11/2006 | Kilbourne et al. ............ | 714/47.2 |
| 7,307,908 | B2* | 12/2007 | Gilton ............................. | 365/222 |
| 7,783,956 | B2* | 8/2010 | Ko et al. ........................ | 714/763 |
| 8,027,194 | B2* | 9/2011 | Lee et al. .................. | 365/185.03 |
| 8,069,300 | B2* | 11/2011 | Klein ............................... | 711/103 |
| 8,161,232 | B2* | 4/2012 | Mangione-Smith .......... | 711/106 |
| 8,248,831 | B2* | 8/2012 | Rotbard et al. ................. | 365/45 |
| 8,407,395 | B2* | 3/2013 | Kim et al. ....................... | 711/100 |
| 2007/0255896 | A1* | 11/2007 | Mangione-Smith .......... | 711/106 |
| 2007/0294550 | A1* | 12/2007 | May et al. ...................... | 713/320 |
| 2008/0034259 | A1* | 2/2008 | Ko et al. ........................ | 714/718 |
| 2008/0301525 | A1* | 12/2008 | Hirose et al. ................... | 714/763 |
| 2009/0024904 | A1* | 1/2009 | Roohparvar et al. ......... | 714/773 |
| 2009/0132875 | A1* | 5/2009 | Kitahara et al. .............. | 714/721 |

(Continued)

OTHER PUBLICATIONS

Joohee Kim; Papaefthymiou, M.C., "Block-based multi-period refresh for energy efficient dynamic memory," ASIC/SOC Conference, 2001. Proceedings. 14th Annual IEEE International , vol., No., pp. 193,197, 2001.*

(Continued)

*Primary Examiner* — Cynthia Britt
(74) *Attorney, Agent, or Firm* — Harness, Dickey & Pierce, P.L.C.

(57) ABSTRACT

A method for initiating a refresh operation of a solid-state nonvolatile memory device coupled to a processor is disclosed. The method comprises determining an error number for a block of the solid-state nonvolatile memory. The error number corresponds to an amount of error bits in a page of the block having a greatest amount of error bits. The method further comprises comparing the error number with an error threshold and determining a reset number indicating an amount of times that the processor has been reset since a previous refresh operation was performed on the block of the solid-state nonvolatile memory. The method further includes comparing the number of resets with a reset threshold and refreshing the block of the solid-state nonvolatile memory when the number of errors exceeds the error threshold and the number of resets exceeds the reset threshold.

12 Claims, 7 Drawing Sheets

(56) References Cited

U.S. PATENT DOCUMENTS

| | | | |
|---|---|---|---|
| 2009/0310408 A1* | 12/2009 | Lee et al. | 365/185.03 |
| 2009/0327802 A1* | 12/2009 | Fukutomi et al. | 714/6 |
| 2010/0011156 A1* | 1/2010 | Yim et al. | 711/103 |
| 2010/0011276 A1* | 1/2010 | Chen et al. | 714/764 |
| 2010/0017556 A1* | 1/2010 | Chin et al. | 711/103 |
| 2010/0082881 A1* | 4/2010 | Klein | 711/103 |
| 2010/0165689 A1* | 7/2010 | Rotbard et al. | 365/45 |
| 2010/0207189 A1* | 8/2010 | Kellam | 257/316 |
| 2010/0313084 A1* | 12/2010 | Hida et al. | 714/704 |
| 2011/0055471 A1* | 3/2011 | Thatcher et al. | 711/114 |
| 2011/0066808 A1* | 3/2011 | Flynn et al. | 711/118 |

OTHER PUBLICATIONS

Ghosh, M.; Lee, H.-H.S., "Smart Refresh: An Enhanced Memory Controller Design for Reducing Energy in Conventional and 3D Die-Stacked DRAMs," Microarchitecture, 2007. Micro 2007. 40th Annual IEEE/ACM International Symposium on , vol., No., pp. 134,145, Dec. 1-5, 2007.*

Search Report dated Aug. 14, 2012 in corresponding Gt. Britain Application No. GB1204496.2.

* cited by examiner

METHOD FOR INITIATING A REFRESH OPERATION IN A SOLID-STATE NONVOLATILE MEMORY DEVICE

FIELD

The present disclosure relates to a method for initiating a refresh operation of a solid-state nonvolatile memory device.

BACKGROUND

The vast majority of electronic devices include at least one microcontroller or microprocessor that controls the operation of the devices. In order to perform the desired functionality, the microcontroller will execute code or executable instructions for performing specific operations. The microcontroller may also retrieve data for performing the operations. The code and data are stored in a computer readable memory device. Increasingly, manufacturers are using solid-state nonvolatile memory devices, such as NAND flash memory devices, as the computer readable memory.

One issue that arises with NAND flash memory devices, however, is that read inability errors are more commonly observed in these devices. Read inability errors can be permanent such as a bad block error, e.g. a block has been physically damaged, or temporary such as a data retention error and a read disturb error. To cure a data retention error or a read disturb error, the microcontroller, upon detecting such an error, will initiate a refresh operation to refresh the memory block containing the error. A refresh operation restores the contents of the block by deleting the data from the block, and copying backup data into the block from a backup location. Bad block errors, however, cannot be cured by a refresh and tend to be more difficult to resolve. Furthermore, as the number of refresh operations performed increases, the probability of a bad block error occurring at a particular block increases.

To reduce the probability of a bad block error, some microcontrollers will wait a predetermined amount of time before performing a refresh operation, e.g., waiting weeks, months or years before performing a refresh operation. This method, however, assumes that there is a direct correlation between an elapsed time and read inability errors. Further, the predetermined amount of time may be too short, thereby resulting in too many refresh operations and increasing the probability of a bad block error. Conversely, the predetermined amount of time may be too long, thereby resulting in read inability errors for prolonged periods of time. Thus, there is a need for a better method for determining when to initiate a refresh operation.

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

A method for initiating a refresh operation of a solid-state nonvolatile memory device coupled to a processor is disclosed. The method comprises determining an error number for a block of the solid-state nonvolatile memory. The error number corresponds to an amount of error bits in a page of the block having a greatest amount of error bits. The method further comprises comparing the error number with an error threshold and determining a reset number indicating an amount of times that the processor has been reset since a previous refresh operation was performed on the block of the solid-state nonvolatile memory. The method further includes comparing the number of resets with a reset threshold and refreshing the block of the solid-state nonvolatile memory when the number of errors exceeds the error threshold and the number of resets exceeds the reset threshold.

In another aspect of the disclosure, a system for initiating a refresh operation comprising a main controller and a solid-state non-volatile memory device coupled to the main controller is disclosed. The solid state non-volatile memory device is divided into a plurality of blocks, each block having a plurality of pages. The main controller is configured to determine an error number for a block of the plurality of blocks of the solid-state non-volatile memory. The error number corresponds to an amount of error bits in a page of the plurality of pages of the block having a greatest amount of error bits. The main controller is further configured to compare the error number with an error threshold. The main controller is also configured to determine a reset number indicating an amount of times that the main controller has been reset since a previous refresh operation was performed on the block of the plurality of blocks of the solid-state non-volatile memory and to compare the number of resets with a reset threshold. The main controller is further configured to refresh the block of the solid-state non-volatile memory when the number of errors exceeds the error threshold and the number of resets exceeds the reset threshold.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
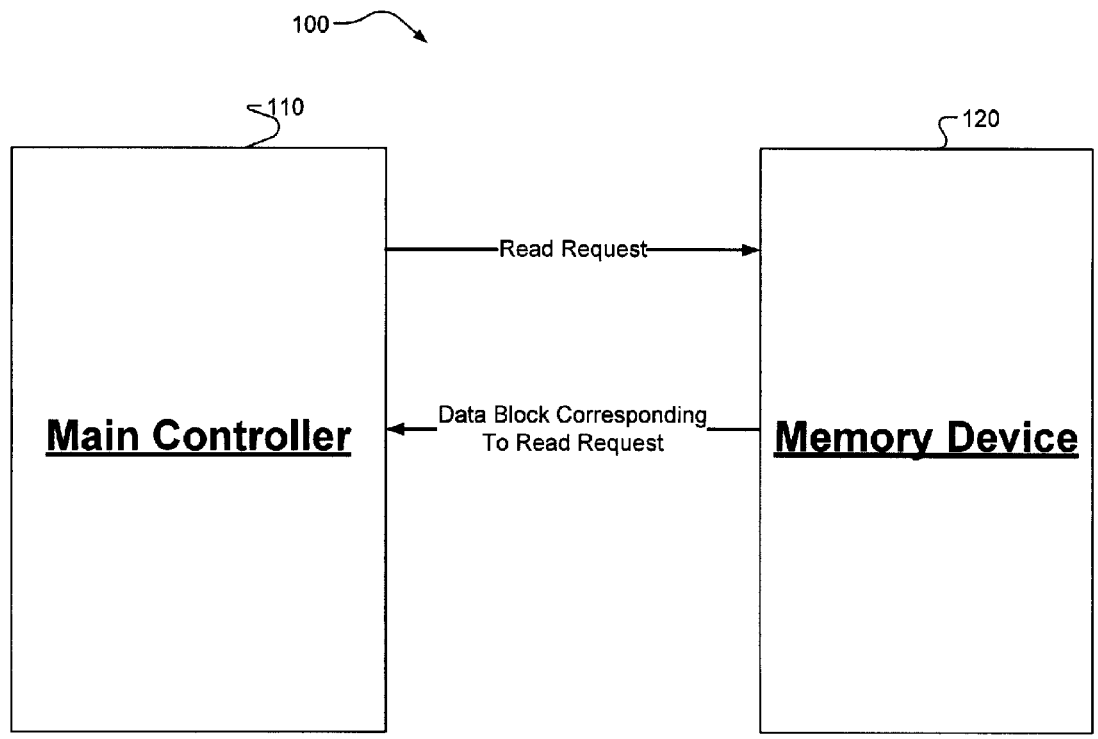
FIG. 1 is a block diagram illustrating exemplary components of a device.

FIG. 1 illustrates components of an exemplary device 100 or subsystem of a device. The device includes a main controller 110 for operating the device 100 and a solid-state nonvolatile memory device 120 that stores executable instructions for operating the device 100 including a device boot loader for the device 100. The main controller 110 transmits read requests to the flash memory device 120, including an address of required data, and the solid-state nonvolatile memory device 120 returns a block beginning at the provided address.

The main controller 110 is a chip set for performing one or more functions. For example, the main controller 110 may be a microprocessor for controlling a telematics device, a television, or a mobile telephone. To perform the intended function, the main controller 110 may execute an operating system which supports the intended functionality. The operating system is comprised of a set of instructions that need to be accessible to the main controller 110. These instructions are stored on the solid-state nonvolatile memory device 120. Furthermore, the operating system may further execute specific applications, which can also be stored in the solid-state nonvolatile memory device 120. Once the operating system is loaded onto the main controller 110, the operating system handles the memory access. Furthermore, the operating system will also handle memory access errors, such as read inability errors.

Upon powering up, the main controller 110 must load the operating system from the solid-state nonvolatile memory device 120. Initially a program referred to as a primary boot loader (PBL) retrieves a program referred to as a device boot loader, or secondary boot loader, from the solid-state nonvolatile memory device 120. For purposes of clarity, the secondary boot loader and the device boot loader are hereinafter referred to as a device boot loader (DBL). The PBL is pre-programmed on the main controller 110 and executes upon the powering of the main controller 110. The PBL is hard-coded with a predetermined address that indicates a block on the solid-state nonvolatile memory 120 where the DBL is stored, e.g. 0x0000. To load the DBL, the PBL requests the block beginning at the predetermined address from the flash memory 120. The solid-state nonvolatile memory 120 returns the block stored at the predetermined address, and the PBL relinquishes control to the DBL, which is stored in the returned block. Once the DBL is loaded, the DBL will instruct the main controller 110 to retrieve the operating system from the solid-state nonvolatile memory device 120.

An issue arises when read inability errors are found in the blocks containing the DBL or the operating system. For purposes of explanation, the blocks containing executable code will be referred to as the program area. In the instance of a read inability error or a data retention error is observed in the program area, the main controller 110 can initiate a refresh operation. In a refresh operation, a block is deleted and a backup copy of the block is written onto the block. The main controller 110 can resolve a predetermined amount of temporary errors using a software solution. As will be discussed below, each unit of a data block, i.e. a page, contains one or more error correction codes (ECC). The main controller 110 can use the ECC to correct errors in the block. The amount of errors that can be corrected using ECC, however, is limited by the amount of errors that can be listed in the ECC fields, e.g. up to 4 ECCs in a page.

It is appreciated that in some embodiments, the solid-state nonvolatile memory device is a flash memory device 120. In some exemplary embodiments, the flash memory device 120 is a NAND flash memory device. It is appreciated that in some embodiments, the solid-state nonvolatile memory device may be comprised of NOR flash memory or other suitable solid-state nonvolatile memories.

Figure 2:
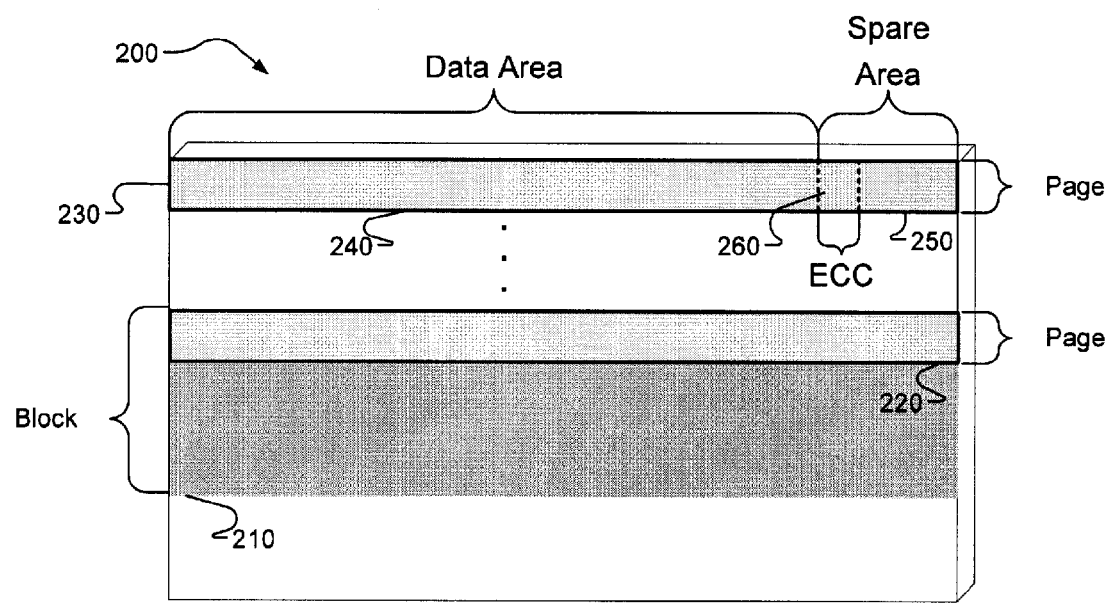
FIG. 2 is a drawing illustrating an exemplary structure of a flash memory device.

FIG. 2 illustrates an exemplary structure of a flash memory device 200. The flash memory device 200 is divided into a plurality of blocks 210. For instance, an exemplary flash memory device 200 can be divided into 1028 blocks. Further, a block 210 is divided into a plurality of pages 220. For instance, an exemplary block 210 can be divided into 64 pages. A page 230 is comprised of a plurality of bytes. For instance, an exemplary page 230 can be comprised of 2112 bytes. Additionally, each page 230 can be broken down into 4 read units of 528 bytes apiece (not shown). It is appreciated that the forgoing values are exemplary and other configurations of a flash memory device 200 are envisioned. For instance, a block may be comprised of 32 pages and a page may be comprised of 4048 bytes.

A page 230 is divided into a main data area 240 and a spare area 250. The main data area 240 contains the stored or substantive data. For instance, if the block is in the program area, the main data area 240 of a particular page 230 could correspond to a particular instruction. It is appreciated that addresses and parameter values can also be stored in the main data area of a page. The spare area 250 stores information relating to the page 230. The spare area 250 includes a plurality of bytes for ECC 260. Typically, the device 100, the flash memory device 120, or the main controller 110 will include a memory controller (not shown) that executes an error checking algorithm to determine if any of the bits in the page contain an error. If so, the ECC section 260 of the spare area will indicate which bit or bits contains an error. Furthermore, additional data such as wear-leveling information, and other software overhead functions can be stored in the spare area 250.

Figure 3:
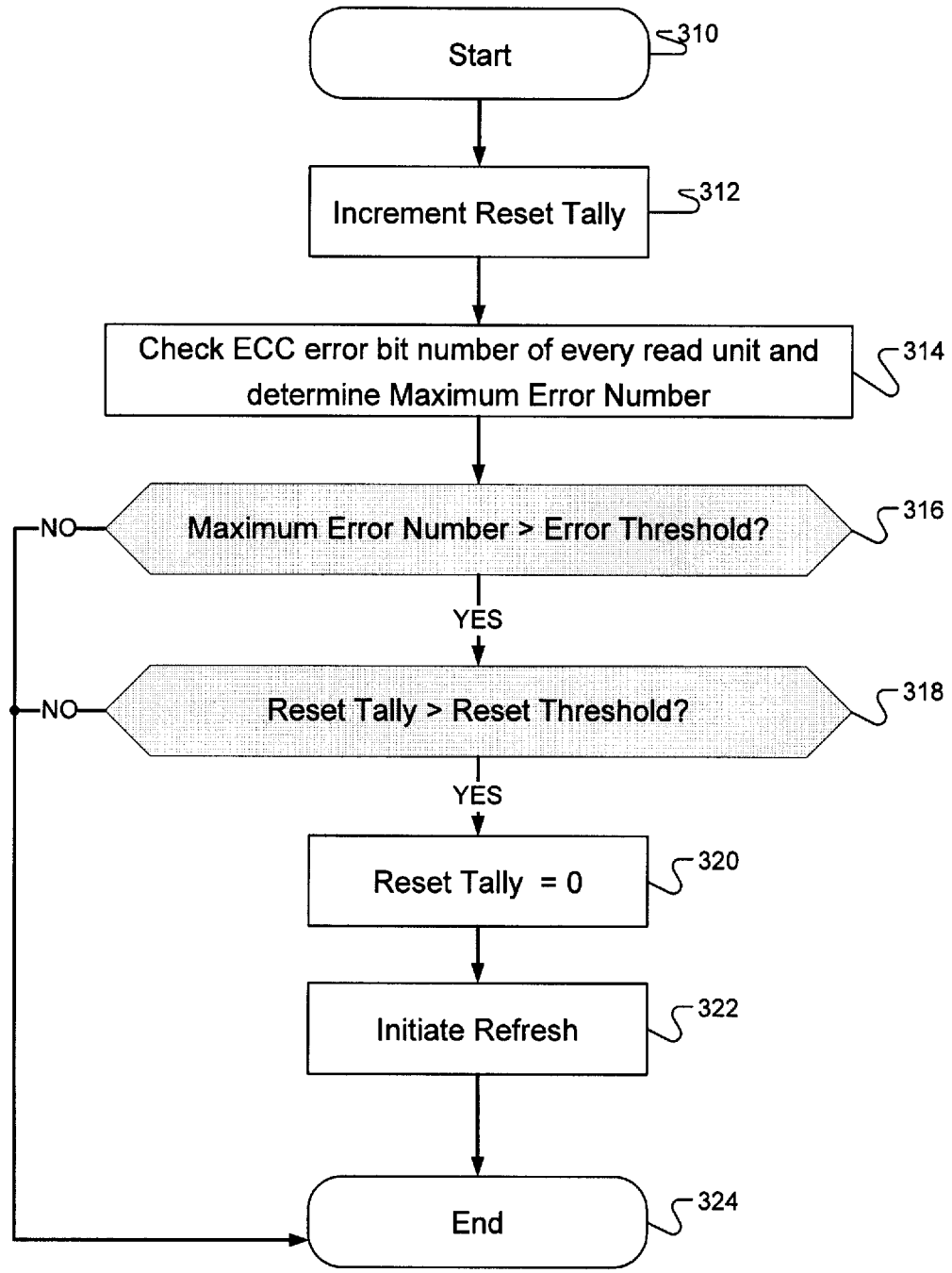
FIG. 3 is a flow chart illustrating an exemplary method for determining when to perform a refresh operation.

The main controller 110 can tally the ECCs in each page of a block to determine if the block requires a refresh, such that the decision to refresh the block is based on a maximum amount of errors in a page of the block and an amount of times the main controller has been reset 110. FIG. 3 illustrates a method for determining when to perform a refresh operation on a particular block. The method can execute upon each new power cycle of the main controller 110. Each time the main controller 110 is reset, a new power cycle begins. A tally of power cycles or resets performed since the block has been refreshed is maintained, e.g. a reset tally. Upon a reset of the main controller 110, the reset tally is incremented, as shown at step 312.

The main controller 110 checks the ECC data of each page in the block being examined and determines a maximum error number for the block, as shown at step 314. The maximum error number is the amount of errors found in the page in the block having the most errors. Each time the main controller 110 boots, the main controller 110 will obtain a program area block. For each page in the program area block, the main controller 110 will check the ECC section of the spare area of the page. The main controller 110 maintains the maximum error number, whereby each time a new page having more errors contained therein is detected, the main controller 110 updates the maximum error number to correspond to the number of errors in the new page having more errors.

Once the maximum error number is determined, the maximum error number is compared with an error threshold, as shown at step 316. The error threshold is a predetermined number which indicates the maximum amount of errors that can be found in a page without triggering a refresh of the block. For instance, the error threshold can be three, such that when four or more errors are found in any page in the block, the method will continue to execute. If the maximum error number does not exceed the error threshold, then a refresh is not performed and the method stops executing, as shown at step 324.

If the maximum error number exceeds the error threshold, then the reset tally is compared to a reset threshold, as shown at step 318. As mentioned previously, the tally is a value indicating a number of resets that have been performed since the previous refresh operation. The reset threshold is a minimum amount of power cycles that must have occurred in order to necessitate a refresh operation. In some embodiments, the reset threshold is a predetermined threshold, e.g. 2000 resets. In some embodiments, the reset threshold is dynamic and based on the maximum error number. If the reset tally does not exceed the reset threshold, then a refresh operation is not performed and the method stops executing. If the reset number exceeds the threshold, then the reset tally is set back to 0, as shown at step 320, and the refresh operation is performed on the block, as shown at step 322.

It is appreciated that variations of the method described above are within the scope of this disclosure. Further, it is noted that the ordering of the steps is not mandatory and some steps may be performed before other steps. Furthermore, some of the steps may be combined into one step, while some steps may be broken into multiple steps. It is also noted that additional steps may be performed.

Figure 4:
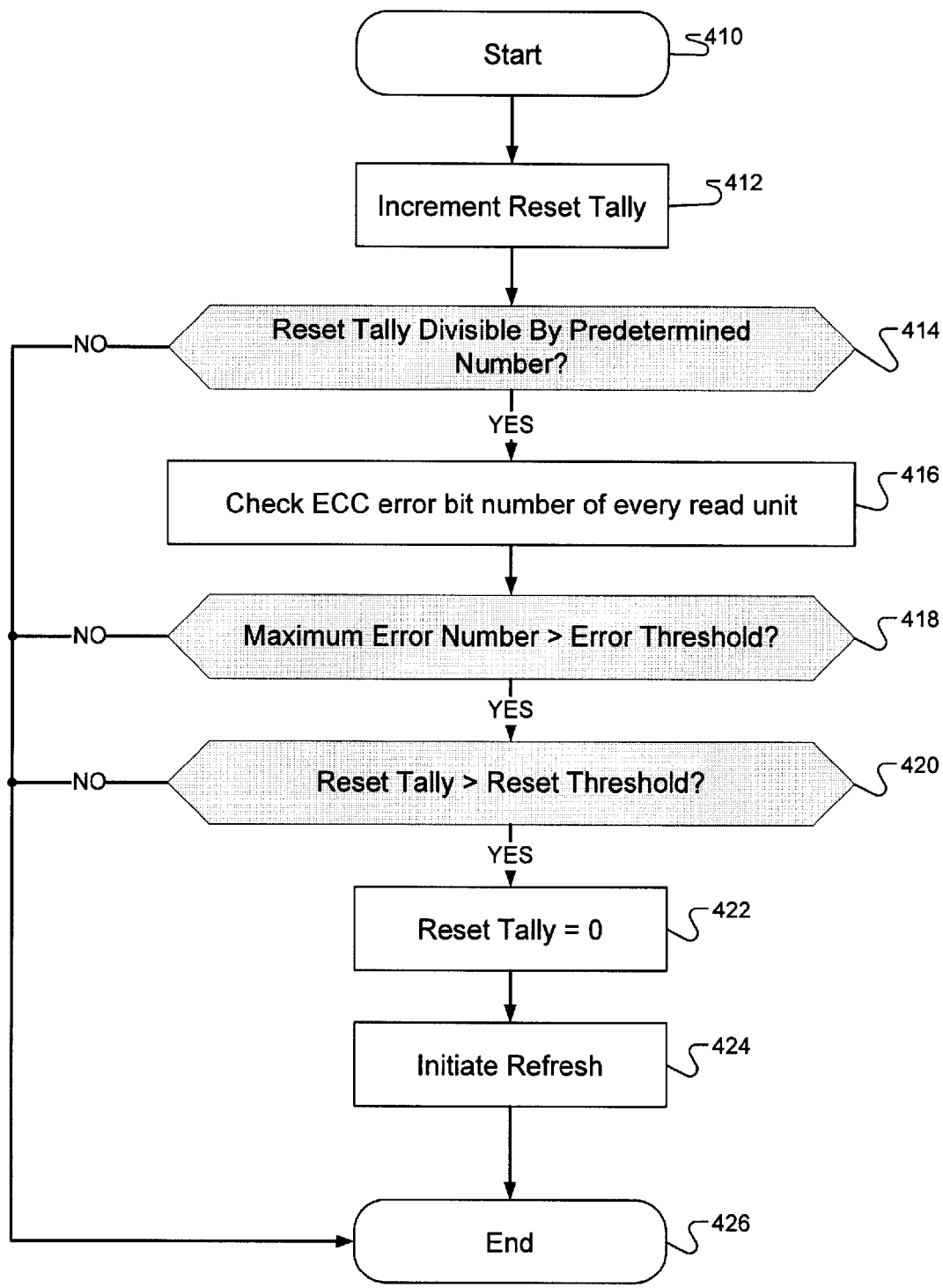
FIG. 4 is a flow chart illustrating an alternative exemplary method for determining when to perform a refresh operation.

In some embodiments, the main controller 110 will only determine whether a refresh is required on specific power cycles, e.g. every $20^{th}$ power cycle. FIG. 4 illustrates an exemplary method for determining whether to perform a refresh operation on specific power cycles. As described with respect to FIG. 3, the determination as to whether to refresh a block is initiated at the beginning of a power cycle. Thus, at the beginning of the power cycle the reset tally is incremented, as shown at step 412. The main controller 110 will determine whether the reset tally is divisible by a pre-determined number, as shown at step 414. For example, the main controller 110 can determine whether the following statement is true:

Reset_tally mod 20==0.

If the reset tally is divisible by the pre-determined number, e.g. Reset_tally mod 20 does equal 0, then the method will continue to execute. If the number of power cycles is not divisible by the pre-determined number the method stops executing, as shown at step 426.

Assuming that the number of power cycles is divisible by the pre-determined number, the main controller 110 will check the ECC error bit number of each page in the data block and determine a maximum error number for the block, as shown at step 416. As was described above, the maximum error number corresponds to the amount of errors observed in the page having the most errors. As previously discussed, the main controller 110 will check the ECC section of the spare area of each page to determine the number of errors in a particular page. The main controller 110 will maintain the maximum error number such that when a new page having more errors is found the main controller updates the maximum error number to correspond to the number of errors in the new page.

Once the maximum error number is determined for a block, the main controller 110 will compare the maximum error number to an error threshold, as shown at step 418. As previously discussed, the error threshold is the number that indicates the maximum amount of errors that can be found in a page without triggering a refresh of the block. For example, the error threshold can be set to three such that when four or more errors are found in any page in the block, the method will continue to execute. If, however, the maximum error number does not exceed the error threshold, then a refresh operation is not performed and the method stops executing, as shown at step 426.

If the maximum error number exceeds the error threshold, then the reset tally is compared to a reset threshold, as shown at step 420. The reset value indicates the number of resets that have been performed since the last refresh operation was performed on the block. The reset threshold corresponds to the minimum amount of power cycles that must have occurred in order to necessitate a refresh operation. In some embodiments their reset threshold is a pre-determined threshold, e.g. 2000, and in other embodiments the reset threshold is dynamically selected based on the maximum error number. If the reset tally exceeds the reset threshold then the reset tally is set back to zero, as shown at step 422, and the refresh operation is performed on the block, as shown at step 424. If the reset tally does not exceed the reset threshold then the refresh operation is not performed and the method stops executing, as shown at step 426.

It is appreciated that variations of the method described above are within the scope of this disclosure. Further, it is noted that the ordering of the steps is not mandatory and some steps may be performed before other steps. Furthermore, some of the steps may be combined into one step, while some steps may be broken into multiple steps. It is also noted that additional steps may be performed.

Figure 5:
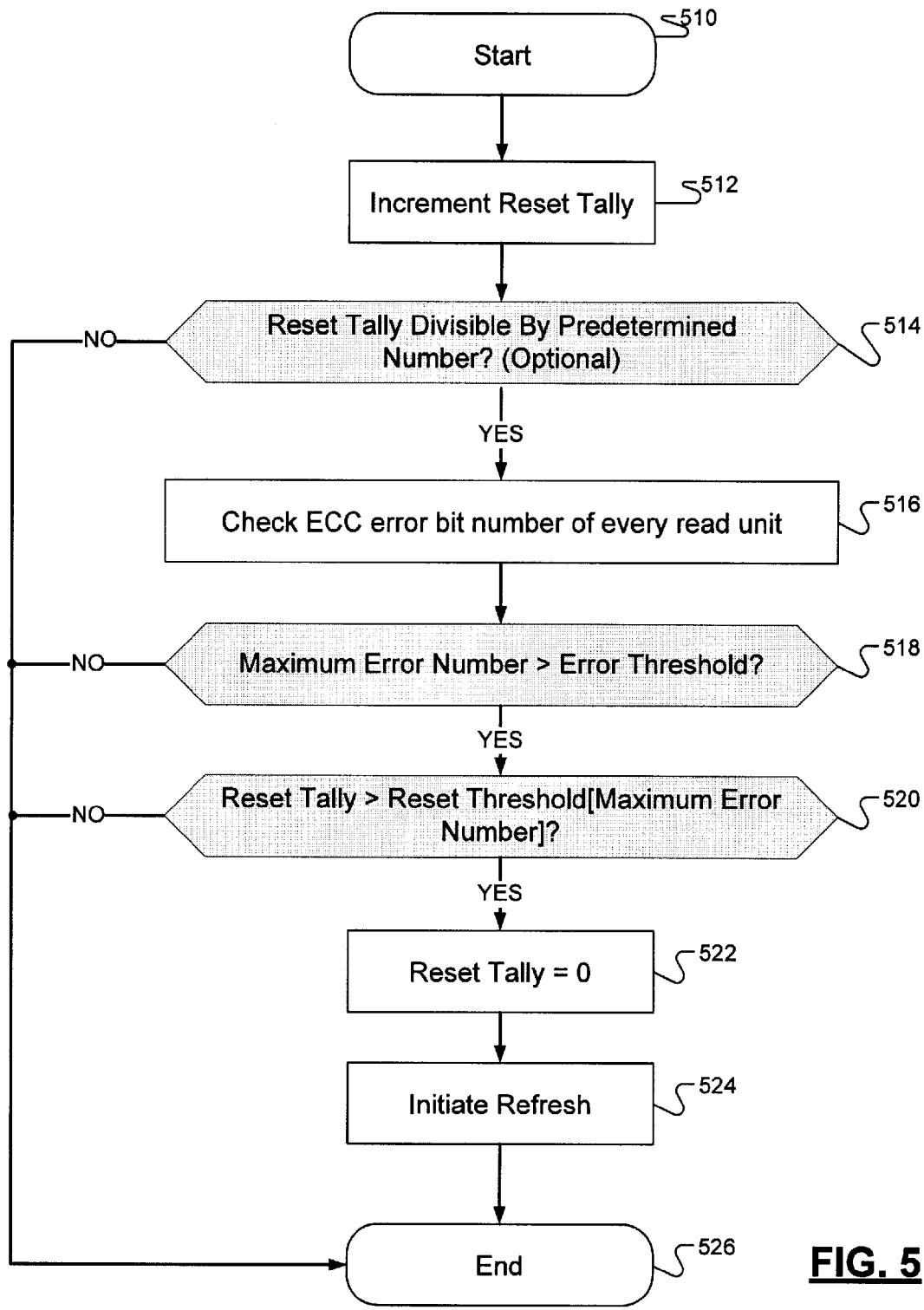
FIG. 5 is a flow chart illustrating an alternative exemplary method for determining when to perform a refresh operation.

As mentioned above, in some embodiments the reset threshold is dynamically set and based on the maximum error number. FIG. 5 illustrates an exemplary method for determining whether to perform a refresh operation using a dynamic reset threshold. The method can begin executing at the beginning of the power cycle. At the beginning of the power cycle the reset tally is incremented, as shown at step 512. In some embodiments the following method is performed only on predetermined power cycles. As discussed above, the main controller 110 will determine if the reset tally is divisible by a predetermined number, e.g. 20, as shown at step 514. If the reset tally is not divisible by the predetermined number, the method will stop executing. If, however, the reset tally is divisible by the predetermined number the method will continue to execute.

Once it is determined that the reset tally is divisible by the predetermined number, the main controller 110 will check the ECC error bin number of each page in the block being analyzed. As discussed, the main controller 110 will check the ECC field in the spare area of each page to determine a maximum error number, as shown at step 516. The maximum error number is then compared to an error threshold, as shown at step 518. If the maximum error number is not greater than the error threshold, then the method stops executing and a refresh operation is not performed, as shown at step 526. If, however, the maximum error number exceeds the error threshold, then the reset tally is compared to the reset threshold as shown at step 520.

In these embodiments, the reset threshold is a function of the maximum error number. As the maximum error number increases the reset threshold will decrease. For example, if the error threshold is one and the maximum error number is two then the reset threshold is set to 2000. If the maximum error number is three, the reset threshold is set to 200. If the maximum error number is four, the reset threshold is set to 20. And if the maximum error number is greater than four, the reset threshold is set to zero. It is appreciated that in the foregoing example, when the maximum error number exceeds 4 a refresh operation will always be performed. It is noted that different reset thresholds may be used as well, and the provided values are merely exemplary. If the reset tally exceeds the reset threshold then the reset tally is set to zero, as shown at step 522, and the refresh operation is initiated for the data block as shown at step 524. If the reset tally does not exceed the reset threshold, a refresh operation is not performed and the method stops executing, as shown at step 526.

It is appreciated that variations of the method described above are within the scope of this disclosure. Further, it is noted that the ordering of the steps is not mandatory and some steps may be performed before other steps. Furthermore, some of the steps may be combined into one step, while some steps may be broken into multiple steps. It is also noted that additional steps may be performed.

As previously mentioned, a refresh operation cannot cure permanent errors in a block of the flash memory 120. For instance, a refresh operation will not resolve a bad block error. The ECC area 250, however, will still indicate that an error has occurred at a bit, despite the error being of a permanent type. Thus, the main controller 110 can be configured to differentiate between permanent read inability errors and temporary read inability errors, and to initiate a refresh operation when the number of temporary errors exceed an error threshold. By taking into account the permanent errors when determining to perform a refresh, the main controller 110 can avoid performing a refresh operation when the block would still have a significant amount of errors after the refresh operation is performed.

Figure 6:
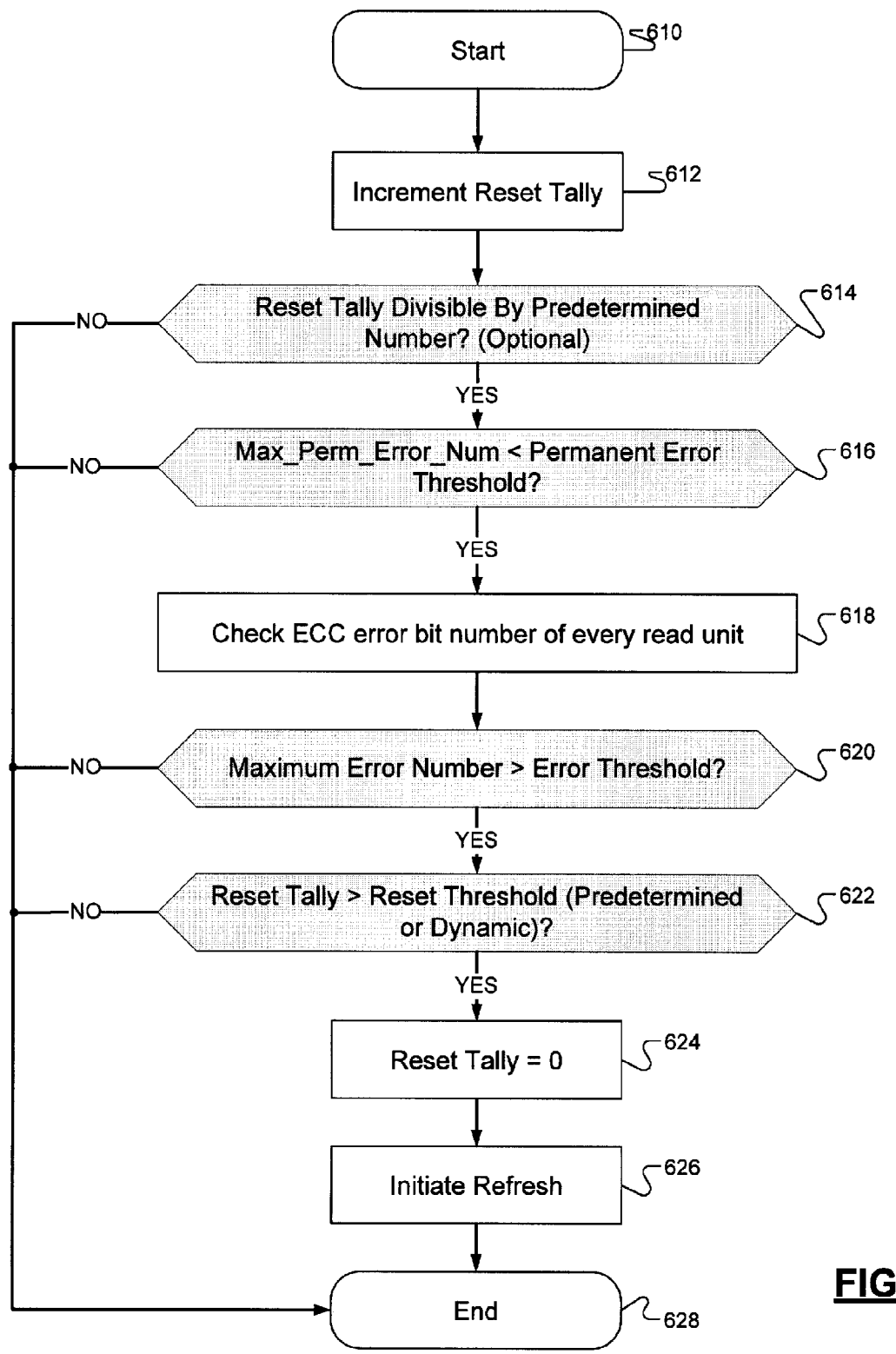
FIG. 6 is a flow chart illustrating an alternative exemplary method for determining when to perform a refresh operation.

FIG. 6 illustrates an exemplary method for determining when to initiate a refresh operation on a block based on an amount of temporary bit errors in a page of the block. Upon executing, the main controller 110 will increment the reset tally, as shown at step 612. The method can execute every power cycle or at predetermined power cycles. In the later scenario, the main controller 110 will determine if the reset tally is divisible by a predetermined number, as shown at step 614, before continuing to execute.

Figure 7:
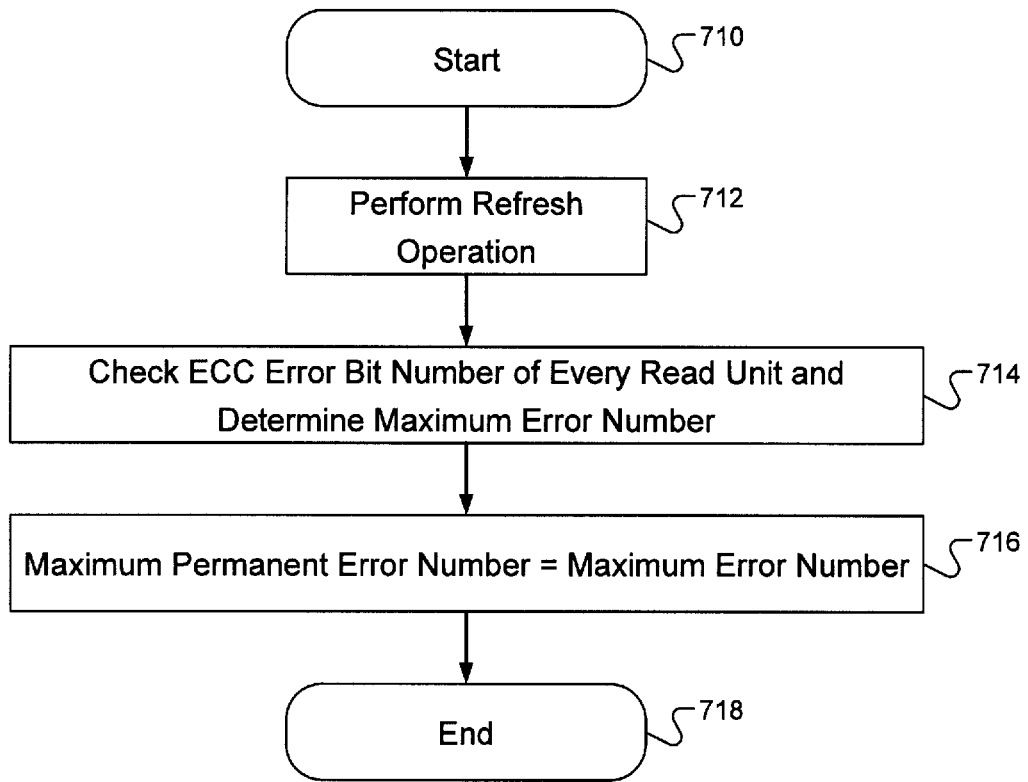
FIG. 7 is a flow chart illustrating an exemplary method for determining an amount of permanent errors in a block of a flash memory device.

The main controller 110 maintains a maximum permanent error number. The maximum permanent error number is the maximum number of permanent bit errors in any page of a block. For instance, if a particular page has three permanent errors, and all other pages have at most two permanent errors, then the maximum permanent error number is three. FIG. 7, which is described in greater detail below, describes a method for determining the maximum permanent error number. The main controller 110 will compare the maximum permanent error number with a permanent error threshold, as shown at step 616. If the maximum permanent error number is greater than or equal to a permanent error threshold, then the main controller 110 stops executing the method, as shown at step 628. Otherwise, the main controller 110 continues to execute the method.

The main controller 110 will then determine the maximum error number for the block, as described above and shown at step 618. The maximum error number is then compared to an error threshold, as shown at step 620. If the maximum error number does not exceed the threshold, then the main controller 110 stops executing the method. Otherwise, the main controller will compare the reset tally to a reset threshold, as shown at step 622 As described above, the reset threshold can be predetermined, e.g. 2000, or dynamic, such that the reset threshold is based on the maximum error number. If the reset tally exceeds the reset threshold, then the reset tally is set to 0, as shown at step 624, and a refresh operation is started for the block. Otherwise, the reset tally is maintained, a refresh operation is not performed, and the main controller 110 stops executing the method.

It is appreciated that variations of the method described above are within the scope of this disclosure. Further, it is noted that the ordering of the steps is not mandatory and some steps may be performed before other steps. Furthermore, some of the steps may be combined into one step, while some steps may be broken into multiple steps. It is also noted that additional steps may be performed.

FIG. 7 illustrates an exemplary method for determining an amount of maximum permanent errors for a block. After a refresh operation is performed, the temporary bit errors in the block are resolved. Thus, if an ECC field still indicates that an error exists in a page after a refresh operation, the inference that can be drawn is that the bit error is a permanent error because the refresh operation did not cure the bit error. Thus, the main controller 110 will perform a refresh operation, as shown at 712, and then determine the maximum error number for the block directly after the refresh operation, as shown at step 714. The maximum permanent error number is set equal to the newly determined maximum error number, as shown at step 716. As described with respect to FIG. 6, in some embodiments, when the maximum permanent error number exceeds a permanent error threshold, then refresh operations are not performed on the block.

It is appreciated that variations of the method described above are within the scope of this disclosure. Further, it is noted that the ordering of the steps is not mandatory and some steps may be performed before other steps. Furthermore, some of the steps may be combined into one step, while some steps may be broken into multiple steps. It is also noted that additional steps may be performed.

The following description is merely illustrative in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term controller may refer to, be part of, or include an Application Specific Integrated Circuit (ASIC); an electronic circuit; a combinational logic circuit; a field programmable gate array (FPGA); a processor (shared, dedicated, or group) that executes code; other suitable components that provide the described functionality; or a combination of some or all of the above, such as in a system-on-chip. The term controller may include memory (shared, dedicated, or group) that stores code executed by the processor.

The term code, as used above, may include software, firmware, and/or microcode, and may refer to programs, routines, functions, classes, and/or objects. The term shared, as used above, means that some or all code from multiple controllers may be executed using a single (shared) processor. In addition, some or all code from multiple controllers may be stored by a single (shared) memory. The term group, as used above, means that some or all code from a single controller may be executed using a group of processors. In addition, some or all code from a single controller may be stored using a group of memories.

The apparatuses and methods described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

The broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A method for initiating a refresh operation of a solid-state non-volatile memory device coupled to a processor comprising:
   determining an error number for a block of the solid-state non-volatile memory, wherein the error number corresponds to an amount of error bits in a page of the block having a greatest amount of error bits;
   comparing the error number with an error threshold;
   determining a reset number indicating an amount of times that the processor has been reset since a previous refresh operation was performed on the block of the solid-state non-volatile memory;
   comparing the number of resets with a reset threshold; and
   refreshing the block of the solid-state non-volatile memory when the error number exceeds the error threshold and the reset number exceeds the reset threshold.

2. The method of claim 1 wherein the reset threshold is dynamically based on the error number.

3. The method of claim 1 wherein the reset threshold is predetermined.

4. The method of claim 1 wherein the solid-state non-volatile memory device is a flash memory device.

5. The method of claim 4 wherein the flash memory device is a NAND flash memory device.

6. The method of claim 1 wherein the error number is determined from an error correcting code field of each page of a block in the solid-state non-volatile memory device.

7. A system for initiating a refresh operation comprising:
   a main controller;
   a solid-state non-volatile memory device coupled to the main controller, the solid state non-volatile memory device being divided into a plurality of blocks, each block having a plurality of pages;
   the main controller configured to
      a) determine an error number for a block of the plurality of blocks of the solid-state non-volatile memory, wherein the error number corresponds to an amount of error bits in a page of the plurality of pages of the block having a greatest amount of error bits;
      b) compare the error number with an error threshold;
      c) determine a reset number indicating an amount of times that the main controller has been reset since a previous refresh operation was performed on the block of the plurality of blocks of the solid-state non-volatile memory;
      d) compare the number of resets with a reset threshold; and
      e) refresh the block of the solid-state non-volatile memory when the errors number exceeds the error threshold and the reset number exceeds the reset threshold.

8. The system of claim 7 wherein the reset threshold is dynamically based on the error number, such that the reset threshold decreases as the error number increases.

9. The system of claim 7 wherein the reset threshold is predetermined.

10. The system of claim 7 wherein the solid-state non-volatile memory device is a flash memory device.

11. The system of claim 10 wherein the flash memory device is a NAND flash memory device.

12. The system of claim 7 wherein each page is divided into a main area and a spare area, wherein the spare area stores metadata relating to data stored in the main area, including an error correcting code field, which indicates the error number of the page.

* * * * *

UNITED STATES PATENT AND TRADEMARK OFFICE
CERTIFICATE OF CORRECTION

PATENT NO.       : 8,756,474 B2                                               Page 1 of 1
APPLICATION NO.  : 13/052305
DATED            : June 17, 2014
INVENTOR(S)      : Hiroaki Shibata et al.

It is certified that error appears in the above-identified patent and that said Letters Patent is hereby corrected as shown below:

In the Claims

Col. 9, line 14, claim 1, (line 10, claim 1), delete "number of resets" and insert --reset number--.

Col. 10, line 13, claim 7, (line 9, claim 10), delete "number of resets" and insert --reset number--.

Col. 10, line 16, claim 7, (line 11, claim 10), delete "errors" and insert --error--.

Signed and Sealed this
Thirtieth Day of September, 2014

Michelle K. Lee
*Deputy Director of the United States Patent and Trademark Office*